United States Patent [19]

Voncken

[11] Patent Number: 4,489,338
[45] Date of Patent: Dec. 18, 1984

[54] MEMORY CELL WITH THICK OXIDE AT LEAST AS DEEP AS CHANNEL STOP

[75] Inventor: Wilhelmus G. Voncken, Eindhoven, Netherlands

[73] Assignee: U.S. Philips Corporation, New York, N.Y.

[21] Appl. No.: 319,166

[22] Filed: Nov. 9, 1981

[30] Foreign Application Priority Data

Nov. 28, 1980 [NL] Netherlands ................. 8006482

[51] Int. Cl.³ ............... H01L 29/78; H01L 29/90; H01L 27/10; H01L 29/34
[52] U.S. Cl. .................... 357/23; 357/13; 357/45; 357/52
[58] Field of Search ............ 357/23 C, 23 CS, 13, 357/13 PT, 45, 52

[56] References Cited

U.S. PATENT DOCUMENTS

| 3,755,001 | 8/1973 | Kooi et al. | 357/23 CS |
| 3,936,858 | 2/1976 | Seeds et al. | 357/23 CS |
| 3,997,799 | 12/1976 | Baker | 357/45 |
| 4,135,289 | 1/1979 | Brews et al. | 357/23 C |
| 4,240,092 | 12/1980 | Kuo | 357/23 C |
| 4,251,571 | 2/1981 | Garbarino et al. | 357/23 C |
| 4,373,248 | 2/1983 | McElroy | 357/91 |
| 4,392,210 | 7/1983 | Chan | 357/23 C |

Primary Examiner—Martin H. Edlow
Assistant Examiner—Jerome Jackson, Jr.
Attorney, Agent, or Firm—Robert T. Mayer; Steven R. Biren

[57] ABSTRACT

In a dynamic memory cell, the mutual cross-talk is considerably reduced by providing a diffused selection line below a layer of thick oxide (for example, LOCOS). As a result of this the capacitive coupling with other selection lines is considerably reduced, as is the capacity of the selection line with respect to channel stopping regions provided between the memory cells.

6 Claims, 9 Drawing Figures

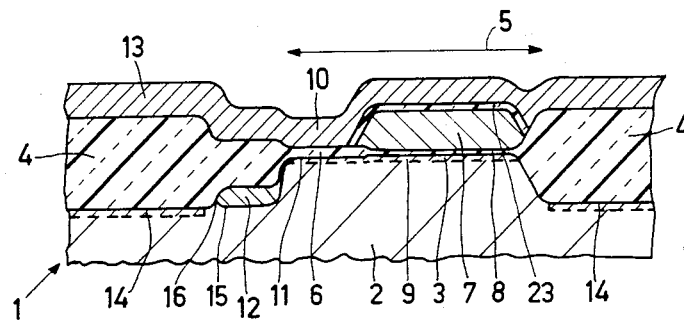
FIG.5
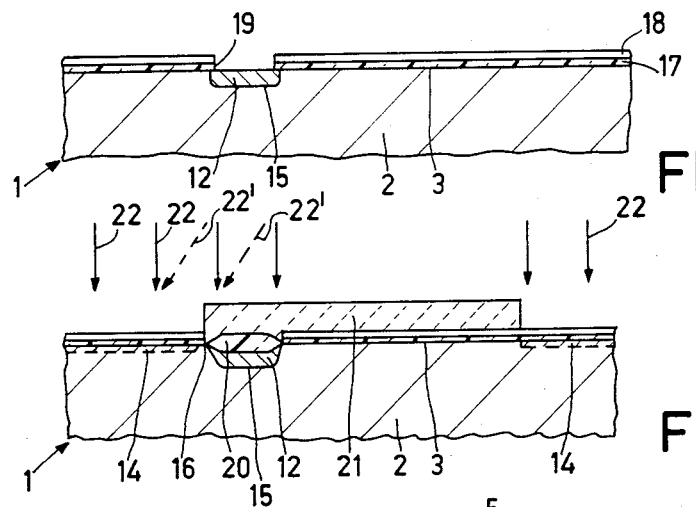
FIG.6
FIG.7
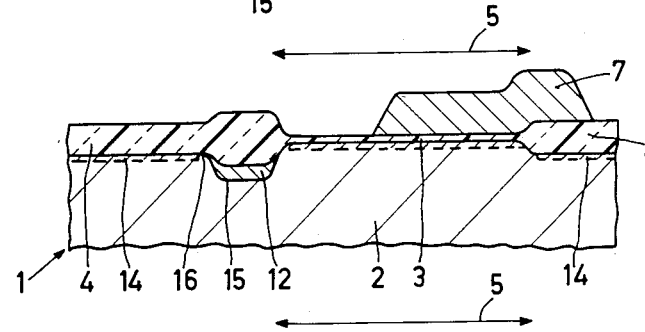
FIG.8
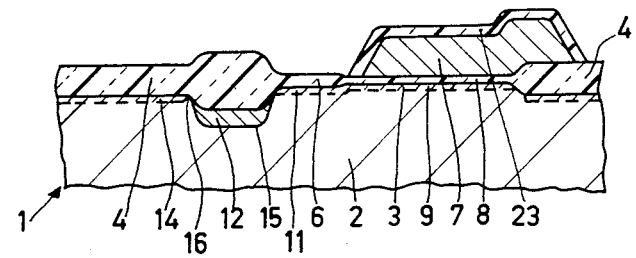
FIG.9

MEMORY CELL WITH THICK OXIDE AT LEAST AS DEEP AS CHANNEL STOP

BACKGROUND OF THE INVENTION

The invention relates to a semiconductor device having at least one memory cell comprising a semiconductor body having a surface region of a first conductivity type which is covered with a thick insulating layer. An aperture is provided in the insulating layer at the area of a storage element of the memory cell, which storage element comprises a capacitor having a first plate of electrically conductive material and a part of the semiconductor body which is separated from the first plate by a dielectric and which forms a second plate of the capacitor and is connected to a semiconductor zone of a second conductivity type opposite to the first via a channel region controllable by a gate electrode. The insulating layer is thicker than the dielectric and the gate electrode is electrically connected to a first selection line of conductive material of the memory cell, said selection line extending to above the semiconductor zone which forms part of a second selection line of the memory cell.

Such semiconductor devices are used in dynamic memories, for example, in computers, microprocessors and various other devices for data storage and data handling.

A semiconductor device of the above-mentioned kind is disclosed in Japanese Patent Application No. 53-76687. The device described in that Application comprises a memory cell which is realized in an aperture in a layer of thick oxide present on the semiconductor body. The memory cell consists inter alia of a storage capacitor which is connected by means of a controllable channel region to a semiconductor zone of a conductivity type opposite to that of the semiconductor body. The conductivity state of the channel region is determined by the voltage at a gate electrode at the area of the conduction channel, which gate electrode is connected electrically to a first selection line of the memory cell. The semiconductor zone forms part of a second selection line of the memory cell.

The first selection line is provided so that within the aperture in the thick oxide it crosses the second selection line and is separated therefrom by a thin layer of oxide. This gives rise to a high stray capacitance and associated capacitive coupling between the two selection lines. This coupling may result in the memory cell in question being wrongly selected or incorrect information being written or read.

Moreover, the device shown in the Japanese Patent Application comprises so-called channel stopping regions, zones of the same conductivity type as the semiconductor body but having a higher doping of impurities so as to prevent channel formation between various memory cells. The semiconductor zone which forms part of the second selection line is generally very highly doped so as to prevent too high a series resistance in the selection line.

In the prior art device the semiconductor zone adjoins a channel stopping region and forms a p-n junction therewith. As a result of the mutual high impurity dopings, said p-n junction will have a comparatively low breakdown voltage. In addition, said p-n junction represents an extra stray capacitance, the value of which will be higher as the doping in the channel stopping region becomes higher.

SUMMARY OF THE INVENTION

It is an object of the invention to provide a semiconductor device of the above-mentioned type in which the capacity between a semiconductor zone belonging to the second selection line and the surrounding semiconductor body in which channel stopping regions are realized is as small as possible, while in addition the breakdown voltage between the semiconductor zone and the surrounding semiconductor body is as high as possible.

Another object of the invention is to provide such a device in which the capacitive coupling between the two selection lines is considerably less.

The invention is based on the recognition of the fact that, in plan view, a channel stopping region can be provided substantially beside the semiconductor zone without a p-n junction being formed between two highly doped semiconductor regions between said channel stopping region and the semiconductor zone.

In addition it is based on the recognition of the fact that the capacitive coupling between the two selection lines can be considerably reduced by using a favorable positioning of said lines with respect to each other.

For this purpose, a semiconductor device according to the invention is characterized in that the semiconductor zone is present substantially entirely below the thick insulating layer, which thick insulating layer at the area of the semiconductor zone extends into the semiconductor body down to a depth different from the depth at other places at the surface.

It is to be noted that providing the semiconductor zone below a thick oxide is known per se from IBM Technical Disclosure Bulletin, Vol. 15, No. 4, p. 1163. As a result of this measure, the dielectric between the two selection lines is a few times (5 to 10 times) as thick as in the device according to the Japanese Patent Application. The capacitive coupling is also reduced by such a factor and the possibility of incorrect selection and erroneous writing or reading is considerably reduced.

A preferred embodiment in accordance with the invention is characterized in that the insulating layer at the area of the semiconductor zone has a larger thickness than the remaining insulating layer.

In this manner the capacitance between the semiconductor zone and the surrounding semiconductor body is determined substantially by the p-n junction between the semiconductor zone and the low-doped semiconductor body. Since the semiconductor body is low-doped, the depletion layer of the p-n junction in the reverse direction extends far into said semiconductor body. This means that the capacitance associated with said p-n junction is low while the associated breakdown voltage is increased.

Moreover, uniform channel stopping regions may be provided below the less thick insulating layer beside the semiconductor zones. The thick insulating layer extends at the area of the semiconductor zone preferably into the semiconductor body down to a depth which is at least equal to the maximum depth of the channel stopping regions.

The advantage thereof is that channel stopping region and semiconductor zone, viewed in plan view, can be provided substantially beside each other without said regions contacting each other. In this manner, the formation of a p-n junction having a high capacity in the reverse direction and a low breakdown voltage, as described above, is avoided.

The same advantage is achieved in another preferred embodiment of the invention which is characterized in that the thick insulating layer beyond the region of the semiconductor zone extends into the semiconductor body down to a depth which is at least equal to the maximum depth of the p-n junction between the semiconductor zone and the semiconductor body.

BRIEF DESCRIPTION OF THE DRAWING

The invention will now be described in greater detail with reference to a few embodiments and the drawing, in which:

FIG. 2 is a cross-sectional view taken on the line II—II of FIG. 1, while

FIGS. 3, 4 and 5 show variations of the device shown in FIG. 2 and

FIGS. 6 to 9 show the device of FIG. 2 during various stages of its manufacture.

Figure 1:
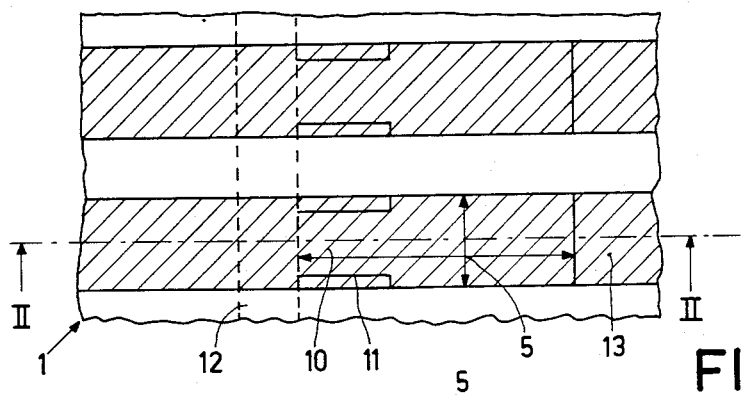
FIG. 1 is a plan view of a semiconductor device according to the invention.

The figures are diagrammatic and not to drawn to scale; for clarity in the cross-sectional views the dimensions in the direction of thickness are strongly exaggerated. Semiconductor zones of the same conductivity type are generally shaded in the same direction; corresponding parts in the various embodiments are generally referred to by the same reference numerals.

DESCRIPTION OF THE PREFERRED EMBODIMENTS

Figure 2:
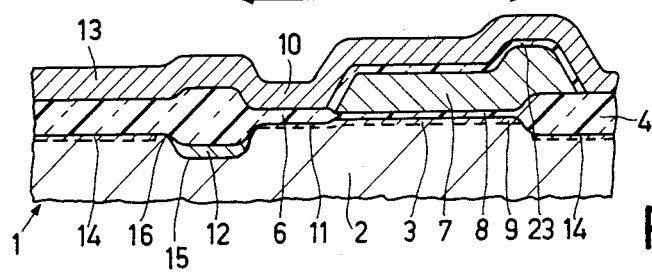

FIG. 1 is a plan view and FIG. 2 is a cross-sectional view taken on the line II—II of FIG. 1 of a semiconductor device having a memory cell. The semiconductor device of FIGS. 1 and 2 comprises a semiconductor body 1 of silicon having a substrate 2. This substrate is of the p-type and has a resistivity from 10 to 100 $\Omega$cm. The surface 3 of the substrate 2 is covered with an approximately 0.5 micrometer thick layer 4 of silicon oxide. In this thick oxide 4 an aperture 5 is present at the area of a storage element of a memory cell. Said memory cell may form both a single cell and form part of a larger system having a cross-bar system of a first and a second group of selection lines, in which memory cells are present at the area of crossings of the cross-bar system.

The surface 3 within the aperture 5 is covered with a thin layer 6, 8 of insulating material, in this example silicon oxide. With the part 8 of this thin oxide as a dielectric, a first plate 7 of electrically conductive material and the underlying region 9 of the semiconductor substrate 2 form a storage capacitor of a memory element. The electrically conductive material of the first plate 7 consists in this example of polycrystalline silicon having a sheet resistance of 20–30 ohm/$\square$.

The contents of the memory cell are determined by the charge which is stored in said capacitor. In order to be able to charge or discharge the capacitor, the device furthermore comprises a gate electrode 10, which is separated from an underlying channel region 11 in the substrate 2 by the part 6 of the thin oxide. In this example the gate electrode 10 forms part of a first selection line 13 of conductive material, for example, aluminum. By means of electric voltages which are applied to the gate electrode 10, the underlying channel region 11 is brought into or out of the conductive state so that the region 9 is switchably connected to a semiconductor zone 12 which forms part of a second selection line. This highly doped semiconductor zone 12 is of the n-type and has a sheet resistance of 30 ohm/$\square$.

According to the invention, the semiconductor zone 12 is present substantially entirely below the thick oxide 4. Due to the large thickness of said layer (0.5–1 micrometer the capacitive coupling between the first selection line 13 and the semiconductor zone 12 is very small. In a memory system having several of these cells this means that the capacitive coupling between the word lines and the bit lines of the system is substantially negligible.

The capacitive coupling between the selection line 13 and the semiconductor zone 12 is even further reduced in the present example in that the oxide 4 at the area of the semiconductor zone 12 has a larger thickness (approximately 0.8 micrometer) than elsewhere. Thus, a substantially uniform channel stopping region 14 can be provided between several memory cells without detrimental effects. If as a matter of fact the oxide 4 at the area of the semiconductor zone 12 extends at least in the semiconductor body 1 down to the maximum depth of the channel stopping region 14, the semiconductor zone 12 is circumferentially surrounded by the low-doped substrate 2. This means that the depletion region associated with the p-n junction 15 between the semiconductor zone 12 and the substrate 2, when the p-n junction 15 is operated in the reverse direction, extends in the substrate 2 for a considerable distance. The stray capacitance associated with the p-n junction 15 thus is small and the stray capacitance of the p-n junction 16, i.e. the part of the p-n junction 15 between the semiconductor zone 12 and the channel stopping region 14 or the semiconductor substrate 2 in so far as it adjoins the surface, is also very small, which means that the memory cell has short writing and reading times. On the other hand the breakdown voltage of the p-n junction 15, 16 is increased by this measure.

Figure 3:
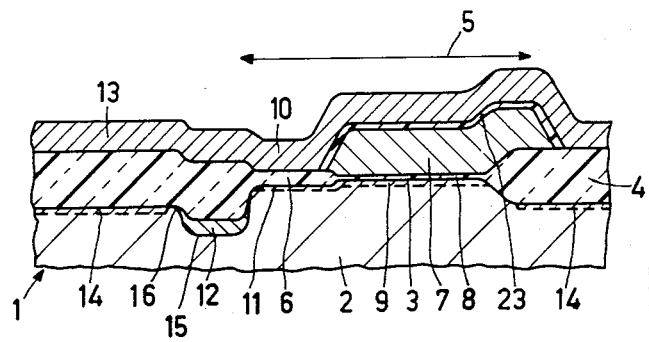

The last-mentioned effects (short writing and reading times, high breakdown voltage) are achieved in addition to the small coupling between the selection line 13 and the semiconductor zone 12 in the embodiment shown in FIG. 3, where the thick oxide 4 at the area of a semiconductor zone 12 is sunk deeper in the semiconductor body than in other places at the surface. In this embodiment the oxide 4 has a substantially uniform thickness. Otherwise the reference numerals have the same meanings as in FIG. 2.

Figure 4:
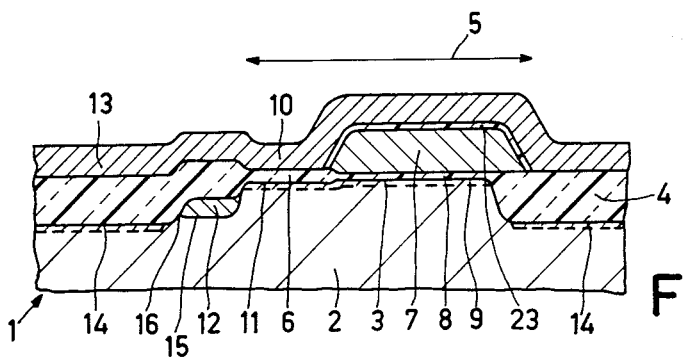

Another embodiment of a semiconductor device in accordance with the invention is shown in FIG. 4. In this embodiment the thick oxide 4 at the area of the channel stopping region 14 is sunk deeper in the semiconductor body than at the area of the semiconductor zone 12. This oxide 4, which in this embodiment again has a substantially uniform thickness, extends into the substrate 2 down to a depth which is at least equal to the depth of the p-n junction 15 between the semiconductor zone 12 and the substrate 2.

This is also achieved in the embodiment of FIG. 5, in which the thick oxide 4 at the area of the channel stopping regions 14 is thicker than that at the area of the semiconductor zone 12. Otherwise the reference numerals in FIGS. 4 and 5 again have the same meanings as those of FIG. 2.

The semiconductor device shown in FIGS. 1 and 2 may be manufactured as follows. The starting material is a semiconductor body 1 comprising a p-type substrate, <100> oriented, having a resistivity of 10–100 ohm. cm. A double layer 17, 18 of an approximately 40 nanometers thick layer 17 of silicon oxide and an approximately 75 nanometers thick layer 18 of silicon nitride is then provided on the surface 3 of the substrate 2. A pattern to define the semiconductor zone 12 is provided photolithographically in said double layer 17, 18. In this example the said semiconductor zones 12 form the bit lines of a memory matrix. For this purpose, apertures 19 are provided in the double layer 17, 18. Said line-shaped apertures have a width of 2–3 micrometers. Via these apertures the semiconductor zones 12 are provided in the substrate 2 by means of an arsenic implantation with a dose of $5.10^{15}$ arsenic ions/cm$^2$ and an energy of 100 keV. This results in a sheet resistance of approximately 30 ohm/□ for the semiconductor zones 12 (FIG. 6).

A layer of silicon oxide 20 is then grown in a thickness of approximately 0.3 micrometer by means of local oxidation at the area of the aperture 19. During this oxidation the donor atoms (arsenic) are pushed forward by the grown oxide in the substrate 2 in which towards the edge of the oxide 20 along the so-called bird-beak a doping of arsenic atoms is obtained which decreases both in thickness and in concentration. In order to define the active regions of the semiconductor surface 3, a layer 21 of photoresist is provided over the surface 3 and is then patterned photolithographically. In order to produce a good electrical separation between the memory elements, a channel stopping implantation is then carried out, using the same photoresist 21 as a mask, with acceptor ions (boron) with a dose of $10^{13}$ boron ions/cm$^2$ at an energy of 30 keV. The channel stopping regions 14 are then formed. In order to obtain a low capacity and high breakdown voltage of the p-n junction 16, i.e. the part of the p-n junction 15 between the semiconductor zone 12 and the substrate 2 immediately adjoining the surface 3, said implantation may be carried out, if desired, in a slightly skewed starting direction (according to the arrows 22' instead of according to the arrows 22). As a result of this, a part of the low-doped substrate between the semiconductor zone 12 and the channel stopping region 14 may extend up to the surface 3, for example, in a width of 0.1 micrometer. This distance is much smaller than can be achieved by means of exclusively photolithographic methods. (FIG. 7).

The part of the nitride 18 not covered by the photoresist layer 21 is then removed. After removing the photoresist layer 21, the exposed surface is then locally oxidized to a thickness of approximately 0.5 micrometer using the remaining part of the double layer 16, 18 as a mask. At the area of the semiconductor zone 12 the oxide 4 obtains a thickness of approximately 0.8 micrometer. The remaining double layer 17, 18 in the aperture 5 is then removed. The surface 3 in the aperture 5 in the thick oxide 4 is then provided with a thin layer of clean oxide (approximately 50 nanometers). If desired, a boron implantation may be carried out using the oxide 4 as a mask so as to accurately adjust the threshold voltage which determines the conductivity of the channel zone 11. In this state, windows may be provided in said oxide for contacts elsewhere on the semiconductor body. The whole surface is then provided with a layer of polycrystalline silicon 7, having a sheet resistance of 20–30 ohm/□ which is then patterned photolithographically (FIG. 8).

The assembly is then placed in an oxidizing atmosphere, for example in a water vapor atmosphere. An oxide layer 23 is formed which protects the polycrystalline silicon 7, while simultaneously the oxide 6 at the area of the channel region 11 obtains a slightly larger thickness (FIG. 9). The oxide 23 grows approximately 4 times as fast as the oxide 6, so that good insulation between the conductive plate 7 and the selection line 13 to be provided afterwards is obtained while the oxide 6 remains sufficiently thin to maintain good control by means of the gate electrode 10.

Between these latter two steps, if desired, the memory cells may be temporarily screened if, for example for transistors in the peripheral logic, implantations have to be carried out for source and drain regions. After having provided the required contact windows in said peripheral logic, the assembly is covered with a layer of aluminum which comprises 1% silicon for a wiring pattern. The selection lines 13, in this example word lines which also comprise the gate electrode 10, are then defined herefrom photolithographically. The semiconductor device shown in FIGS. 1, 2 is then obtained.

After the aperture 19 in FIG. 6 has been defined, a groove with a depth of approximately 0.2 micrometer may also be etched in the substrate. If desired the first oxidation step to obtain the oxide 20 may then be omitted so that the FIG. 3 configuration is obtained.

In order to obtain the semiconductor devices shown in FIGS. 4 and 5, for example, first the channel stopping regions 14 are provided by means of apertures in the double layer 17, 18. A recess may then be etched again first at the area of said channel stopping regions 14, in which the channel stopping regions 14 are then defined and after which either the double layer at the area of the semiconductor zones 12 to be provided is removed photolithographically, and after the semiconductor zones 12 have been defined by means of local oxidation a thick layer 4 of oxide is provided (FIG. 4), or first local oxidation takes place at the area of the channel stopping regions 14 and then, after defining the semiconductor zones 12, the thick oxide 4 is completed (FIG. 5). In all the examples shown the distance between the channel stopping region 14 and the semiconductor zone 12 in plan view is smaller than 0.5 micrometer and usually smaller than 0.1 micrometer, while nevertheless a low capacity of the p-n junction 15, 16 between semiconductor zone 12 and substrate 2, respectively, between semiconductor zone 12 and channel stopping region 14, or an intermediate part of the substrate 2, is ensured.

Of course the invention is not restricted to the above examples. For example, the conductivity types in the semiconductor body may (simultaneously) be reversed. The memory cell may also be realized in an epitaxial layer provided on a substrate. In addition, in the partial region of the semiconductor body which forms the second plate of the capacitor an arsenic implantation may be carried out, for example, simultaneously with the provision of the source and drain regions in the peripheral logic. The arsenic layer thus formed then constitutes the second plate of the capacitor. Furthermore, the layers 7 of polycrystalline silicon forming a first plate of the various capacitors may be connected to a reference voltage, for example ground.

Various variations are also possible in the method of manufacture. For example, the thick oxide need not necessarily be provided by means of local oxidation but, for example, a layer of thick oxide may be provided over the whole surface (in which semiconductor zones 12 and possibly channel stopping regions have already been realized). In this layer 4 of thick oxide apertures 5 may be provided by means of reactive ion etching which expose the surface 3 for the manufacture of the actual memory cell.

What is claimed is:

1. A semiconductor device having at least one memory cell comprising a semiconductor body having a surface region of a first conductivity type which is covered with a thick insulating layer, at least one aperture in the thick insulating layer at the area of a storage element of the memory cell, said storage element comprising a capacitor having a first plate of electrically conductive material and a part of the semiconductor body which is separated from the first plate by a dielectric, which forms a second plate of the capacitor and which is connected to a semiconductor zone of a second conductivity type opposite to the first via a channel region controllable by a gate electrode, the thick insulating layer being thicker than the dielectric and the gate electrode being connected to a first selection line of conductive material of the memory cell, said selection line extending above said semiconductor zone, which zone forms part of a second selection line of the memory cell, said semiconductor zone being present substantially entirely below the thick insulating layer, which thick insulating layer at the area of the semiconductor zone extends into the semiconductor body down to a depth different from the depth at other places at the surface of said body, and at least one channel stopping region of said first conductivity type located beneath said thick insulating layer and adjacent to but spaced apart from said semiconductor zone, so that no p-n junction is formed between said channel stopping region and said semiconductor zone, said at least one channel stopping region comprising substantially uniform channel stopping regions present between several memory cells below the thick insulating layer, the thick insulating layer at the area of the semiconductor zone extending into the semiconductor body down to a depth which is at least equal to the maximum depth of the channel stopping regions.

2. A semiconductor device having at least one memory cell comprising a semiconductor body having a surface region of a first conductivity type which is covered with a thick insulating layer, at least one aperture in the thick insulating layer at the area of a storage element of the memory cell, said storage element comprising a capacitor having a first plate of electrically conductive material and a part of the semiconductor body which is separated from the first plate by a dielectric, which forms a second plate of the capacitor and which is connected to a semiconductor zone of a second conductivity type opposite to the first via a channel region controllable by a gate electrode, the thick insulating layer being thicker than the dielectric and the gate electrode being connected to a first selection line of conductive material of the memory cell, said selection line extending above said semiconductor zone, which zone forms part of a second selection line of the memory cell, said semiconductor zone being present substantially entirely below the thick insulating layer, which thick insulating layer at the area of the semiconductor zone extends into the semiconductor body down to a depth different from the depth at other places at the surface of said body, and at least one channel stopping region of said first conductivity type located beneath said thick insulating layer and adjacent to but spaced apart from said semiconductor zone, so that no p-n junction is formed between said channel stopping region and said semiconductor zone, the thick insulating layer at the area of the semiconductor zone having a larger thickness than that of the remaining portions of the thick insulating layer, and said at least one channel stopping region comprising substantially uniform channel stopping regions present between several memory cells below the thick insulating layer, the thick insulating layer at the area of the semiconductor zone extending into the semiconductor body down to a depth which is at least equal to the maximum depth of the channel stopping regions.

3. A semiconductor device as claimed in claim 1 or 2, characterized in that the maximum lateral distance between the semiconductor zone and the channel stopping region is at most about 0.5 micrometer.

4. A semiconductor device as claimed in claim 1 or 2, characterized in that the semiconductor zone forms part of a common buried selection line for several memory cells.

5. A semiconductor device as claimed in claim 1 or 2, characterized in that the first plate of conductive material of the capacitor comprises polycrystalline silicon.

6. A semiconductor device as claimed in claim 1 or 2, characterized in that the first selection line belongs to a first group of lines which, together with a second group of lines comprising the second selection line, forms a system of cross-bars with the memory cells being present at the area of crossings of the cross-bar system.

* * * * *